United States Patent
Liu et al.

(10) Patent No.: US 8,703,515 B2
(45) Date of Patent: Apr. 22, 2014

(54) METHOD FOR GUIDING CURRENT IN A LIGHT EMITTING DIODE (LED) DEVICE

(71) Applicant: SemiLEDS Optoelectronics Co., Ltd., Miao-Li County (TW)

(72) Inventors: Wen-Huang Liu, Guan-Xi Town (TW); Chen-Fu Chu, Hsinchu (TW); Jiunn-Yi Chu, Hsinchu County (TW); Chao-Chen Cheng, Hsinchu (TW); Hao-Chun Cheng, Pingtung County (TW); Feng-Hsu Fan, Jhonghe (TW); Yuan-Hsiao Chang, Daya Township (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 13/975,410

(22) Filed: Aug. 26, 2013

(65) Prior Publication Data

US 2013/0334982 A1     Dec. 19, 2013

Related U.S. Application Data

(60) Continuation of application No. 13/401,446, filed on Feb. 21, 2012, now Pat. No. 8,546,818, and a continuation-in-part of application No. 13/161,254, filed on Jun. 15, 2011, now Pat. No. 8,148,733, and a continuation-in-part of application No. 12/823,866, filed on Jun. 25, 2010, now Pat. No. 8,003,994, and a division of application No. 12/136,547, filed on Jun. 10, 2008, now Pat. No. 7,759,670.

(60) Provisional application No. 60/943,533, filed on Jun. 12, 2007.

(51) Int. Cl.
*H01L 29/06* (2006.01)
*H01L 29/22* (2006.01)
*H01L 29/26* (2006.01)
*H01L 31/0328* (2006.01)
*H01L 31/0336* (2006.01)
*H01L 31/072* (2012.01)
*H01L 31/109* (2006.01)
*H01L 31/12* (2006.01)

(52) U.S. Cl.
USPC .................. 438/35; 438/29; 438/40; 438/45; 257/79; 257/94; 257/E33.002; 257/E33.012; 257/E33.014

(58) Field of Classification Search
None
See application file for complete search history.

(56) References Cited

U.S. PATENT DOCUMENTS

| 4,249,967 A | 2/1981 | Liu et al. |
| 4,344,984 A | 8/1982 | Kaplan et al. |

(Continued)

OTHER PUBLICATIONS

U.S. Appl. No. 13/401,446, Notice of Allowance dated Jul. 11, 2013, pp. 1-10.

(Continued)

*Primary Examiner* — Zandra Smith
*Assistant Examiner* — Pamela E Perkins
(74) *Attorney, Agent, or Firm* — Stephen A. Gratton

(57) ABSTRACT

Methods for controlling current flow in semiconductor devices, such as LEDs are provided. For some embodiments, a current-guiding structure may be provided including adjacent high and low contact areas. For some embodiments, a second current path (in addition to a current path between an n-contact pad and a substrate) may be provided. For some embodiments, both a current-guiding structure and second current path may be provided.

8 Claims, 10 Drawing Sheets

(56) References Cited

U.S. PATENT DOCUMENTS

| | | | |
|---|---|---|---|
| 4,620,132 | A | 10/1986 | Gordon et al. |
| 4,751,710 | A | 6/1988 | Yamaguchi et al. |
| 4,992,771 | A | 2/1991 | Caporali et al. |
| 5,300,791 | A | 4/1994 | Chen et al. |
| 5,376,580 | A | 12/1994 | Kish et al. |
| 5,404,373 | A | 4/1995 | Cheng |
| 5,459,336 | A | 10/1995 | Kato |
| 5,502,316 | A | 3/1996 | Kish et al. |
| 5,666,376 | A | 9/1997 | Cheng |
| 5,714,014 | A | 2/1998 | Horikawa |
| 5,789,768 | A | 8/1998 | Lee et al. |
| 5,848,086 | A | 12/1998 | Lebby et al. |
| 5,892,787 | A | 4/1999 | Tan et al. |
| 5,943,357 | A | 8/1999 | Lebby et al. |
| 6,998,642 | B2 | 2/2006 | Lin et al. |
| 7,095,765 | B2 | 8/2006 | Liu et al. |
| 7,199,398 | B2 | 4/2007 | Ono et al. |
| 7,288,797 | B2 | 10/2007 | Deguchi et al. |
| 7,301,175 | B2 | 11/2007 | Izuno et al. |
| 7,514,720 | B2 | 4/2009 | Kim et al. |
| 7,679,097 | B2 | 3/2010 | Akaishi |
| 7,759,670 | B2 | 7/2010 | Liu et al. |
| 7,829,909 | B2 | 11/2010 | Yoo |
| 7,888,670 | B2 | 2/2011 | Han et al. |
| 7,935,974 | B2 | 5/2011 | Kim et al. |
| 8,003,994 | B2 | 8/2011 | Liu |
| 8,148,733 | B2 | 4/2012 | Liu et al. |
| 8,546,818 | B2 | 10/2013 | Liu et al. |
| 2003/0141506 | A1 | 7/2003 | Sano et al. |
| 2004/0080022 | A1 | 4/2004 | Ido et al. |
| 2004/0099870 | A1 | 5/2004 | Ono et al. |
| 2005/0017254 | A1 | 1/2005 | Lin et al. |
| 2006/0006402 | A1 | 1/2006 | Hsieh et al. |
| 2006/0043384 | A1 | 3/2006 | Cho et al. |
| 2006/0050755 | A1 | 3/2006 | Suzuki et al. |
| 2006/0081857 | A1 | 4/2006 | Hong et al. |
| 2006/0154393 | A1 | 7/2006 | Doan et al. |
| 2006/0246617 | A1 | 11/2006 | Lee et al. |
| 2006/0289894 | A1 | 12/2006 | Murata et al. |
| 2007/0131958 | A1 | 6/2007 | Hsu et al. |
| 2007/0166851 | A1 | 7/2007 | Tran et al. |
| 2007/0181895 | A1 | 8/2007 | Nagai |
| 2007/0210700 | A1 | 9/2007 | Kato et al. |
| 2007/0212854 | A1 | 9/2007 | Chu et al. |
| 2007/0221944 | A1 | 9/2007 | Yoo |
| 2007/0278506 | A1 * | 12/2007 | Tran ............................... 257/94 |
| 2008/0217634 | A1 | 9/2008 | Liu et al. |
| 2008/0296609 | A1 | 12/2008 | Nagahama et al. |
| 2010/0098127 | A1 | 4/2010 | Higuchi et al. |
| 2010/0102322 | A1 | 4/2010 | Matsumura et al. |
| 2010/0187431 | A1 | 7/2010 | Friedman et al. |
| 2010/0197068 | A1 | 8/2010 | Poon et al. |
| 2010/0201280 | A1 | 8/2010 | McKenzie et al. |
| 2010/0207145 | A1 | 8/2010 | Yoo |
| 2010/0258834 | A1 | 10/2010 | Liu et al. |
| 2011/0101394 | A1 | 5/2011 | Mckenzie et al. |
| 2012/0146083 | A1 | 6/2012 | Liu et al. |

OTHER PUBLICATIONS

U.S. Appl. No. 13/401,446, Non-Final Office Action dated Jun. 19, 2013, pp. 1-6.

U.S. Appl. No. 13/401,446, Non-Final Office Action dated Sep. 27, 2012, pp. 1-8.

PCT International Search Report dated Sep. 29, 2008 in International Application No. PCT/US08/55539.

* cited by examiner

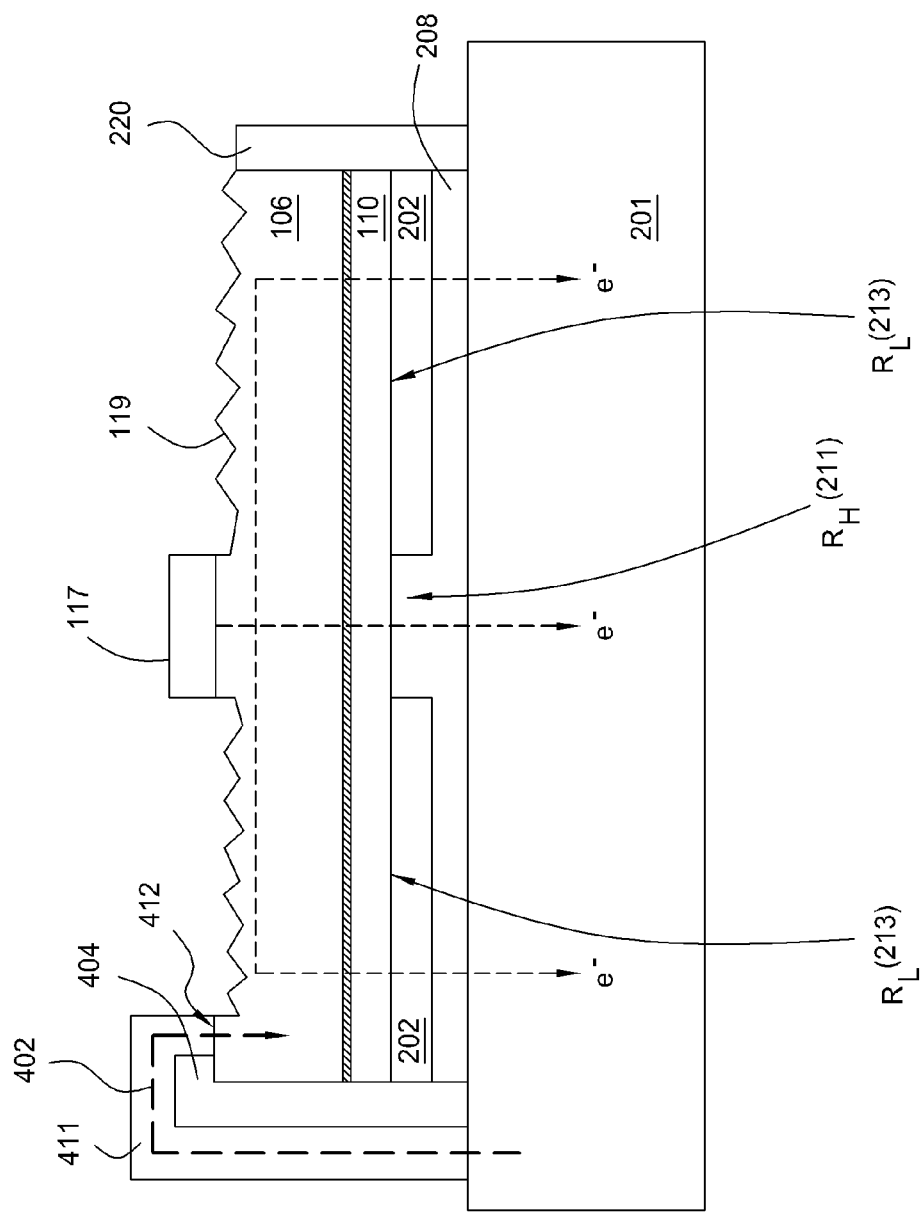
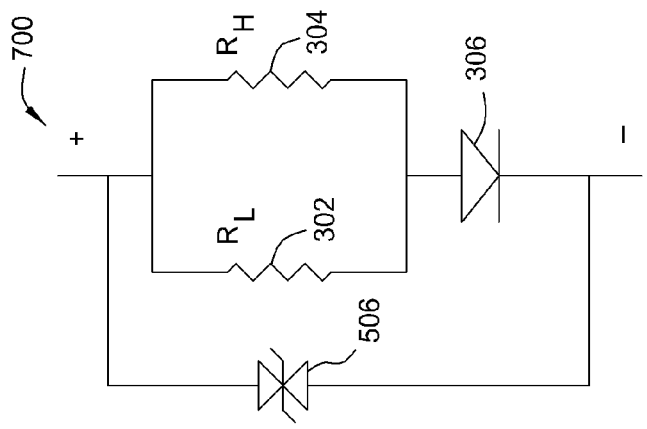
FIG. 6
FIG. 7

METHOD FOR GUIDING CURRENT IN A LIGHT EMITTING DIODE (LED) DEVICE

CROSS-REFERENCE TO RELATED APPLICATIONS

This application is a continuation of Ser. No. 13/401,446, filed Feb. 21, 2012, U.S. Pat. No. 8,546,818, which is a continuation-in-part of Ser. No. 13/161,254, filed Jun. 15, 2011, U.S. Pat. No. 8,148,733, which is a continuation of Ser. No. 12/823,866, filed Jun. 25, 2010, U.S. Pat. No. 8,003,994, which is a division of Ser. No. 12/136,547, filed Jun. 10, 2008, U.S. Pat. No. 7,759,670, which claims the benefit of provisional Ser. No. 60/943,533, all of which are incorporated herein by reference.

BACKGROUND

This disclosure relates generally to semiconductor processing and more particularly to methods for guiding current in light-emitting diode (LED) devices.

During the fabrication of light-emitting diodes (LEDs), an epitaxial structure of an "LED stack" including layers of p-doped GaN and n-doped GaN, for example, may be formed. FIG. 1 illustrates such an example of a conventional LED device 102, having an n-doped layer 106 and a p-doped layer 110 separated by a multi-quantum well (MQW) layer 108. The device 102 is typically deposited on a carrier/growth-supporting substrate (not shown) of suitable material, such as c-plane silicon carbide (SiC) or c-plane sapphire, and bonded via a bonding layer 204 to a thermally and electrically conductive substrate 101. A reflective layer 202 may enhance brightness. Voltage may be applied between the n-doped layer 106 and p-doped layer 110 via an n-electrode 117 and the conductive substrate 101, respectively.

In some cases, it may be desirable to control the amount of current through the n-electrode 117 to the substrate 101, for example, to limit power consumption and/or prevent damage to the device 102. Therefore, an electrically insulative layer 206 may be formed below the p-doped layer 110, in the reflective layer 202, to increase contact resistance below the n-electrode 117 and block current. The insulative layer 206 may be similar to the current-blocking layer described in Photonics Spectra, December 1991, pp. 64-66 by H. Kaplan. In U.S. Pat. No. 5,376,580, entitled "Wafer Bonding of Light Emitting Diode Layers," Kish et al. teach etching a patterned semiconductor wafer to form a depression and bonding the wafer to a separate LED structure such that the depression creates a cavity in the combined structure. When the combined structure is forward biased by applying voltage, current will flow in the LED structure, but no current will flow through the cavity or to the region directly beneath the cavity since air is an electrical insulator. Thus, the air cavity acts as another type of current-blocking structure.

Unfortunately, these approaches to current guiding have a number of disadvantages. For example, the electrically insulative layer 206, the air cavity, and other conventional current-blocking structures may limit thermal conductivity, which may increase operating temperature and compromise device reliability and/or lifetime.

Furthermore, a conventional LED device, such as the device 102 of FIG. 1, may be susceptible to damage from electrostatic discharge (ESD) and other high voltage transients. ESD spikes may occur, for example, during handling of the device whether in fabrication of the LED device itself, in shipping, or in placement on a printed circuit board (PCB) or other suitable mounting surface for electrical connection. Overvoltage transients may occur during electrical operation of the LED device. Such high voltage transients may damage the semiconductor layers of the device and may even lead to device failure, thereby decreasing the lifetime and the reliability of LED devices.

Accordingly improved methods for guiding current through an LED device are needed.

SUMMARY

Embodiments generally provide methods and devices for guiding current in semiconductor devices, such as light-emitting diodes (LEDs).

One embodiment provides an LED. The LED generally includes a substrate; an LED stack for emitting light disposed above the substrate, wherein the LED stack comprises a p-type semiconductor layer and an n-type semiconductor layer; an n-electrode disposed above the n-type semiconductor layer; and an electrically conductive material coupled between the substrate and the n-type semiconductor layer and forming a non-ohmic contact with the n-type semiconductor layer.

Another embodiment provides an LED. The LED generally includes a substrate; an LED stack for emitting light disposed above the substrate, wherein the LED stack comprises a p-type semiconductor layer and an n-type semiconductor layer; an n-electrode disposed above the n-type semiconductor layer; a protective device disposed above the n-type semiconductor; and an electrically conductive material coupled between the substrate and the protective device.

Yet another embodiment provides an LED. The LED generally includes a substrate; a p-electrode disposed above the substrate and having first and second contacts, wherein the first contact has a higher electrical resistance than the second contact; an LED stack for emitting light disposed above the p-electrode, wherein the LED stack comprises a p-type semiconductor layer coupled to the p-electrode and an n-type semiconductor layer; and an n-electrode disposed above the n-type semiconductor layer.

BRIEF DESCRIPTION OF THE DRAWINGS

So that the manner in which the above recited features can be understood in detail, a more particular description of the invention, briefly summarized above, may be had by reference to embodiments, some of which are illustrated in the appended drawings. It is to be noted, however, that the appended drawings illustrate only typical embodiments and are therefore not to be considered limiting of its scope.

FIG. 6 illustrates an example LED device with a current-guiding structure and a second current path.

FIG. 7 illustrates an equivalent circuit to the LED device of FIG. 6.

DETAILED DESCRIPTION

Embodiments generally provide methods for controlling current flow through a semiconductor device, such as a light-emitting diode (LED). The control may be via a current-guiding structure, a second current path, or a combination thereof.

Hereinafter, relative terms such as "above," "below," "adjacent," "underneath," are for convenience of description and are typically not intended to require a particular orientation.

An Exemplary Current-Guiding Structure

Figure 2:
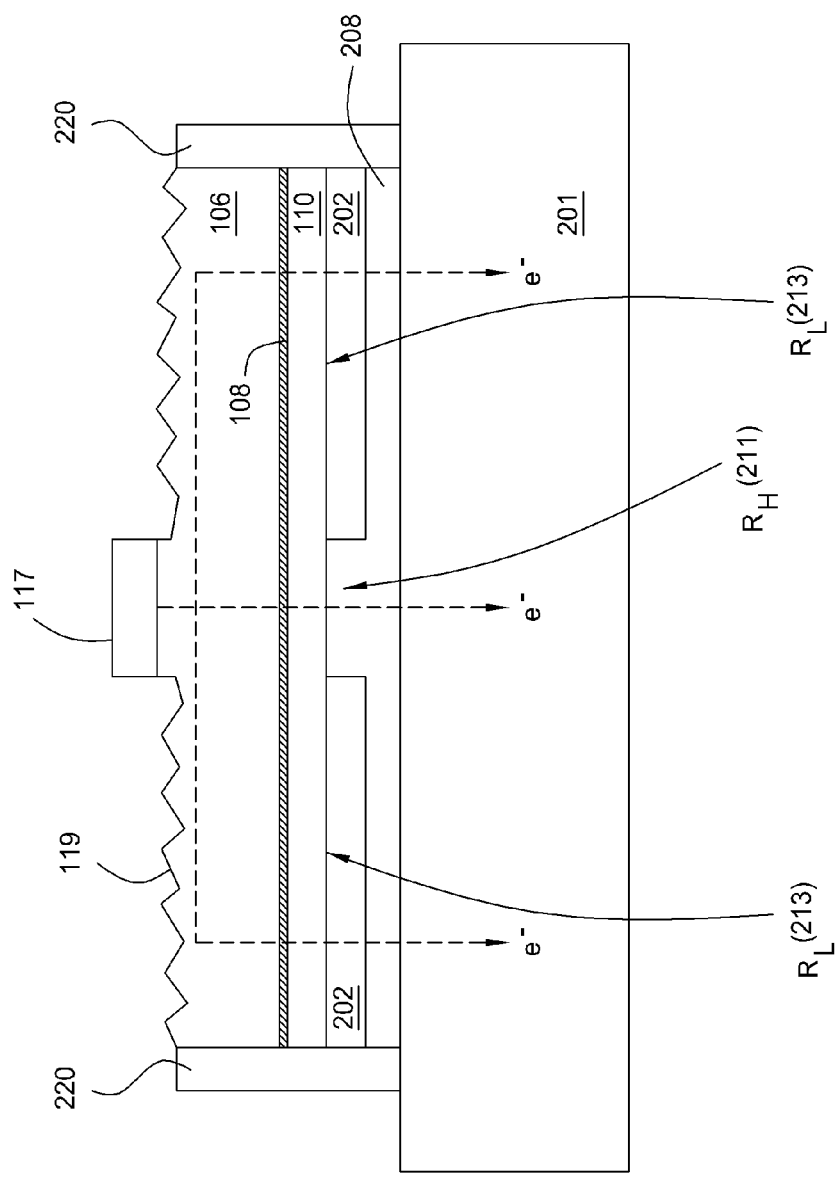
FIG. 2 illustrates an example LED device with a current-guiding structure in accordance with embodiments of the present invention.

FIG. 2 illustrates an example light-emitting diode (LED) device with a current-guiding structure. The device may include a device structure known as an LED stack comprising any suitable semiconductor material for emitting light, such as AlInGaN. The LED stack may include a heterojunction composed of a p-type semiconductor layer 110, an active layer 108 for emitting light, and an n-type semiconductor layer 106. The LED stack may have a top surface 119, which may be roughened as shown in FIG. 2. The LED device may comprise an n-electrode 117 formed on the top surface 119, the n-electrode 117 being electrically coupled to the n-type semiconductor layer 106, and a p-electrode (a reflective layer 202 and a barrier metal layer 208 may function as the p-electrode) on the p-type semiconductor layer 110.

Disposed adjacent to the p-type layer 110 may be a reflective layer 202 interjected by a barrier metal layer 208 forming low contact resistance areas 213 and a high contact resistance area 211, respectively. For some embodiments, the volume of the low contact resistance area 213 is larger than the high contact resistance area 211. Electrically conductive, but having a higher electrical resistance than the low contact resistance area 213, the high resistance contact area 211 may be formed utilizing a metallic material, as described below. The use and careful manipulation of areas with different levels of contact resistance may serve to direct the current to emit light from the active layer in desired areas, such as light emission mainly from the active layer in areas that are not disposed underneath the n-electrode 117 for enhanced light emission.

Figure 1:
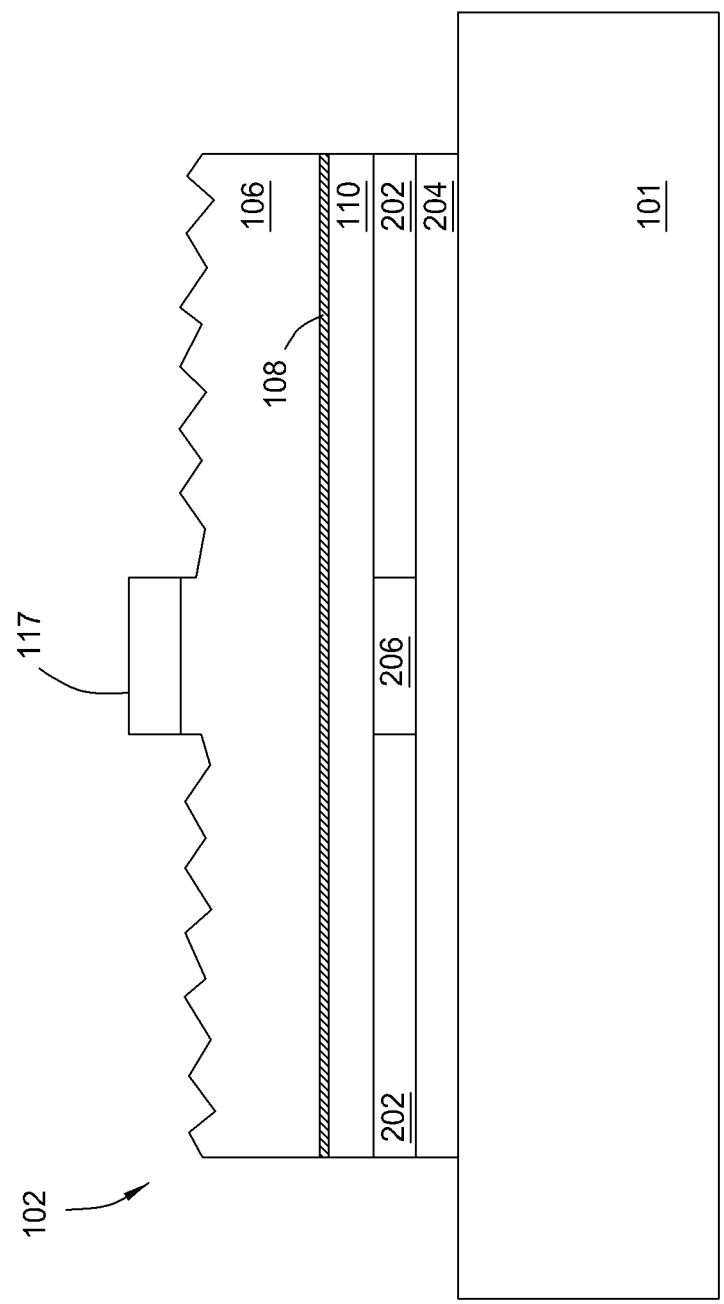
FIG. 1 illustrates a prior art example light-emitting diode (LED) device with a current-guiding structure.

In this manner, the LED device of FIG. 2 with the fully electrically conductive current-guiding structure may have greater thermal conductivity when compared to traditional LED devices with conventional current-blocking or other current-guiding structures, such as the LED device of FIG. 1 with an electrically insulative layer 206. Therefore, the LED device of FIG. 2 and other embodiments of the present disclosure with an electrically conductive current-guiding structure may enjoy decreased operating temperature and increased device reliability and/or lifetime when compared to such traditional LED devices.

Figure 3:
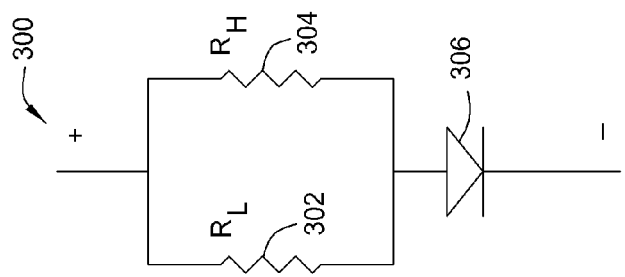
FIG. 3 illustrates an equivalent circuit to the LED device of FIG. 2.

FIG. 3 illustrates an equivalent circuit 300 for the LED device of FIG. 2. As illustrated, the equivalent circuit 300 includes resistors $R_L$ 302 and $R_H$ 304 in parallel that model the equivalent resistances of the high and low resistance contact areas 211, 213 of FIG. 2. Although only one resistor is shown for the low contact resistance area 213, this resistor $R_L$ 302 may represent the lumped equivalent of one or more parallel low contact resistance areas, such as the two areas 213 shown in FIG. 2. In a similar manner, the resistor $R_H$ 304 may represent the lumped equivalent of one or more parallel high contact resistance areas 211. For some embodiments, the equivalent high contact resistance may be at least two times the equivalent low contact resistance. As illustrated, the parallel resistors, $R_L$ 302 and $R_H$ 304, are in series with a diode 306 representing an ideal LED with no series resistance.

One or more layers of a substrate 201 may be disposed adjacent to the p-electrode (composed of the reflective layer 202 and the barrier metal layer 208 in FIG. 2). The substrate 201 may be electrically conductive or semi-conductive. For some embodiments, the substrate 201 may be thermally conductive. A conductive substrate may be a single layer or multiple layers and may comprise, for example, metal or metal alloys, such as Cu, Ni, Ag, Au, Al, Cu—Co, Ni—Co, Cu—W, Cu—Mo, Ge, Ni/Cu, or Ni/Cu—Mo. Such a substrate may be deposited using any suitable thin film deposition technique, such as electrochemical deposition (ECD), electroless chemical deposition (Eless CD), chemical vapor deposition (CVD), metal organic CVD (MOCVD), and physical vapor deposition (PVD). For some embodiments, a seed metal layer may be deposited using electroless chemical deposition, and then one or more additional metal layers of the substrate 201 may be deposited above the seed metal layer using electroplating. A semi-conductive substrate may comprise a single layer or multiple layers and may be composed of silicon (Si) or silicon carbide (SiC), for example. The thickness of the substrate 201 may range from about 10 to 400 μm.

The reflective layer 202 may comprise a single layer or multiple layers comprising any suitable material for reflecting light and having a relatively low electrical resistance compared to materials used to create the high contact resistance area(s) 211. For example, the reflective layer 202 may comprise material such as silver (Ag), gold (Au), aluminum (Al), Ag—Al, silver (Ag), gold (Au), aluminum (Al), Ag—Al, Mg/Ag, Mg/Ag/Ni/, Mg/Ag/Ni/Au, AgNi, Ni/Ag/Ni/Au, Ag/Ni/Au, Ag/Ti/Ni/Au, Ti/Al, Ni/Al, AuBe, AuGe, AuPd, AuPt, AuZn, or using an alloy containing Ag, Au, Al, nickel (Ni), chromium (Cr), magnesium (Mg), platinum (Pt), palladium (Pd), rhodium (Rh), or copper (Cu).

For some embodiments, the low contact resistance area(s) 213 may comprise an omni-directional reflective (ODR) system. An ODR may comprise a conductive transparent layer, composed of such materials as indium tin oxide (ITO) or indium zinc oxide (IZO), and a reflective layer. The ODR may be interjected by a current blocking structure or other suitable structure in an effort to direct the current. An exemplary ODR system is disclosed in commonly-owned U.S. patent application Ser. No. 11/682,780, entitled "Vertical Light-Emitting Diode Structure with Omni-Directional Reflector" and filed on Mar. 6, 2007, herein incorporated by reference in its entirety.

The n-electrode 117 (also known as a contact pad or n-pad) may be a single metal layer or multiple metal layers composed of any suitable material for electrical conductivity, such as Cr/Au, Cr/Al, Cr/Al, Cr/Pt/Au, Cr/Ni/Au, Cr/Al/Pt/Au, Cr/Al/Ni/Au, Ti/Al, Ti/Au, Ti/Al/Pt/Au, Ti/Al/Ni/Au, Al, Al/Pt/Au, Al/Pt/Al, Al/Ni/Au, Al/Ni/Al, Al/W/Al, Al/W/Au, Al/TaN/Al, Al/TaN/Au, Al/Mo/Au. The thickness of the n-electrode 117 may be about 0.1~50 μm. The n-electrode 117 may be formed by deposition, sputtering, evaporation, electroplating, electroless plating, coating, and/or printing on the top surface 119 of the LED stack.

The barrier metal layer 208 may be a single layer or multiple layers comprising any suitable material for forming the high contact resistance area(s) 211. For example, the barrier metal layer 208 may comprise materials such as Ag, Au, Al, molybdenum (Mo), titanium (Ti), hafnium (Hf), germanium (Ge), Mg, zinc (Zn), Ni, Pt, tantalum (Ta), tungsten (W), W—Si, W/Au, Ni/Cu, Ta/Au, Ni/Au, Pt/Au, Ti/Au, Cr/Au, Ti/Al, Ni/Al, Cr/Al, AuGe, AuZn, Ti/Ni/Au, W—Si/Au, Cr/W/Au, Cr/Ni/Au, Cr/W—Si/Au, Cr/Pt/Au, Ti/Pt/Au, Ta/Pt/Au, indium tin oxide (ITO), and indium zinc oxide (IZO).

As illustrated in FIG. 2, protective layers 220 may be formed adjacent to the lateral surfaces of the LED device. These protective layers 220 may serve as passivation layers in an effort to protect the LED device, and especially the heterojunction, from electrical and chemical conditions in the environment.

The high and low contact resistance areas may be formed, for example, by depositing one or more layers serving as the reflective layer 202 by any suitable process, such as electrochemical deposition or electroless chemical deposition. Areas designated for high contact resistance areas 211 may be removed in the reflective layer 202 by any suitable process, such as wet etching or dry etching. Following removal of the designated areas, a barrier metal layer 208 may be formed in the voided spaces within the reflective layer 202. For some embodiments as illustrated in FIG. 2, the barrier metal layer 208 composing the high contact resistance area(s) 211 may fill in the voided spaces within the reflective layer 202 and cover the reflective layer.

For some embodiments, the LED stack top surface 119 may be patterned or roughened to increase light extraction when compared to LED stacks with a smooth top surface. The top surface 119 may be patterned or roughened using any suitable technique (e.g., wet or dry etching).

Figure 9:
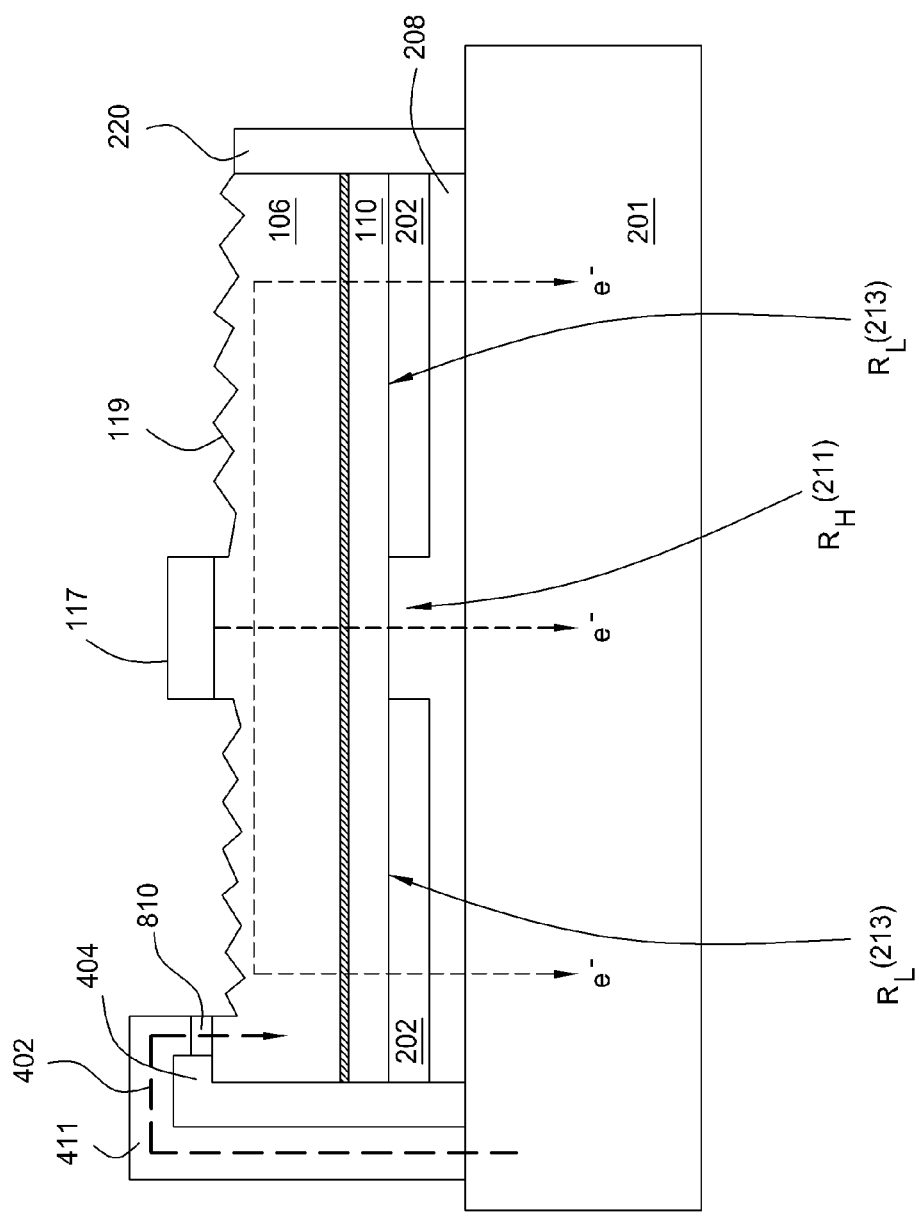
FIG. 9 illustrates an example LED device with a current-guiding structure and a second current path with a protective device.

For some embodiments, the current-guiding structure described herein may be combined with a second current path as illustrated in FIGS. 6 and 9. This second current path is described in greater detail below, with reference to FIG. 4.

An Exemplary Second Current Path

Figure 4:
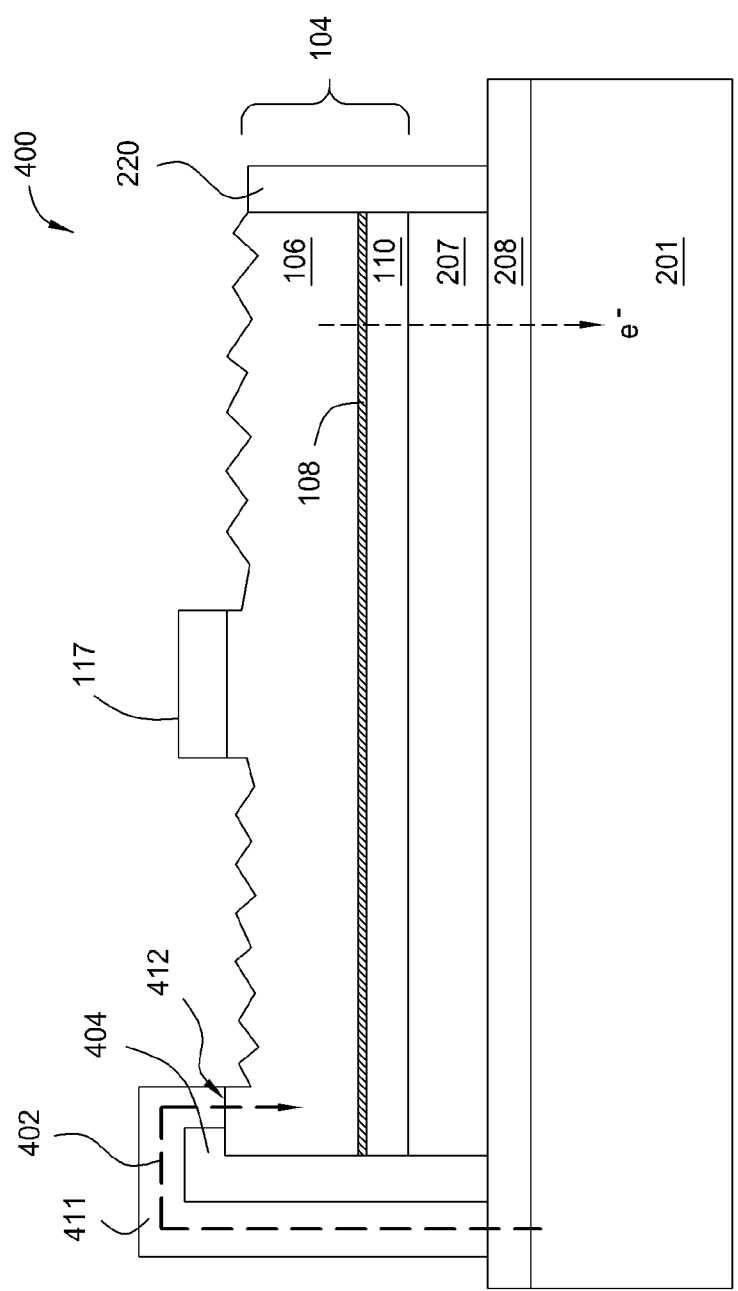
FIG. 4 illustrates an example LED device with a second current path.

FIG. 4 illustrates an example light-emitting diode (LED) device 400 with a second current path 402. As illustrated, the LED device 400 may include a substrate 201, a p-electrode 207 disposed above the substrate 201, an LED stack 104 disposed above the p-electrode 207, and an n-electrode 117 disposed above the LED stack 104. The substrate 201 may be thermally conductive and electrically conductive or semiconductive, as described above. The LED stack 104 may include a heterojunction, which may comprise a p-type semiconductor layer 110, an active layer 108 for emitting light, and an n-type semiconductor layer 106. A second electrically conductive material 411 may be coupled to the substrate 201 and to the n-type semiconductor layer 106 to form a non-ohmic contact 412 with n-type semiconductor layer 106 in an effort to provide a second current path 402 between the substrate 201 and the n-semiconductor layer 106. The second conductive material 411 may be formed via any suitable process, such as e-beam deposition, sputtering, and/or printing.

As illustrated, an electrically insulative layer 404 may separate the second conductive material 411 and at least a portion of the LED stack 104. The insulative layer 404 may comprise any suitable electrically insulative material, such as $SiO_2$, $Si_3N_4$, $TiO_2$, $Al_2O_3$, $HfO_2$, $Ta_2O_5$, spin-on glass (SOG), MgO, polymer, polyimide, photoresistance, parylene, SU-8, and thermoplastic. For some embodiments, the protective layers 220 may serve as the insulative layer 404.

As described above, the substrate 201 may be a single layer or multiple layers comprising metal or metal alloys, such as Cu, Ni, Ag, Au, Al, Cu—Co, Ni—Co, Cu—W, Cu—Mo, Ge, Ni/Cu and Ni/Cu—Mo. The thickness of the substrate 201 may be about 10 to 400 μm.

Figure 5:
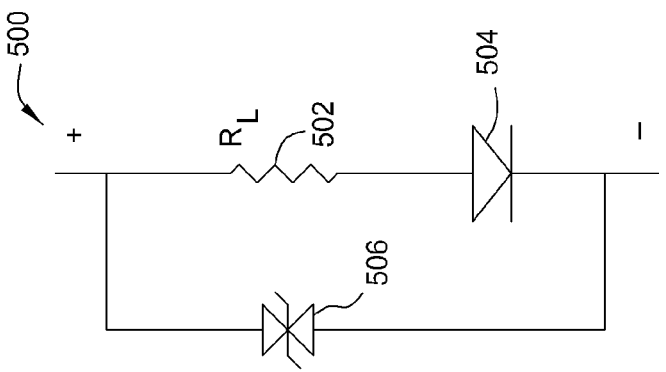
FIG. 5 illustrates an equivalent circuit to the LED device of FIG. 4.

FIG. 5 illustrates an equivalent circuit 500 for the LED device of FIG. 4. As illustrated, the equivalent circuit 500 includes two parallel current paths. The first current path includes an equivalent resistor $R_L$ 502 in series with an ideal LED 504 forming a forward current path from the substrate 201 to the n-electrode 117. The second current path 402 is represented by a bidirectional transient voltage suppression (TVS) diode 506. The TVS diode 506 may operate similar to two opposing zener diodes connected in series and may serve to protect the resistor 502 and ideal LED 504 from high voltage transients. The TVS diode 506 can respond to over-voltages faster than other common over-voltage protection components (e.g., varistors or gas discharge tubes) making the TVS diode 506 useful for protection against very fast and often damaging voltage transients, such as electrostatic discharge (ESD). The second conductive material 411 of FIG. 4 may form the TVS diode 506 of FIG. 5. The second conductive material 411 may shunt excess current in either direction when the induced voltage exceeds the zener breakdown potential.

FIG. 6 illustrates another example LED device with a second current path 402. As illustrated, an LED device with a second current path 402 may also include the current-guiding structure resulting from separate high and low resistance contact areas 211, 213. For example, these different contact areas may be formed by the interjection of the reflective layer 202 by the barrier metal layer 208, as described above with respect to FIG. 2.

FIG. 7 illustrates an equivalent circuit 700 to the LED device of FIG. 6. As illustrated, the single equivalent resistance $R_L$ 502 of FIG. 5 is replaced by the parallel combination of $R_H$ 304 and $R_L$ 302 to represent adjacent high and low contact resistance areas 211, 213 of FIG. 6. The remainder of the circuit 700 is equivalent to the circuit 500 of FIG. 5. In other words, the LED device of FIG. 6 may have the advantages of current guiding and transient suppression.

Figure 8:
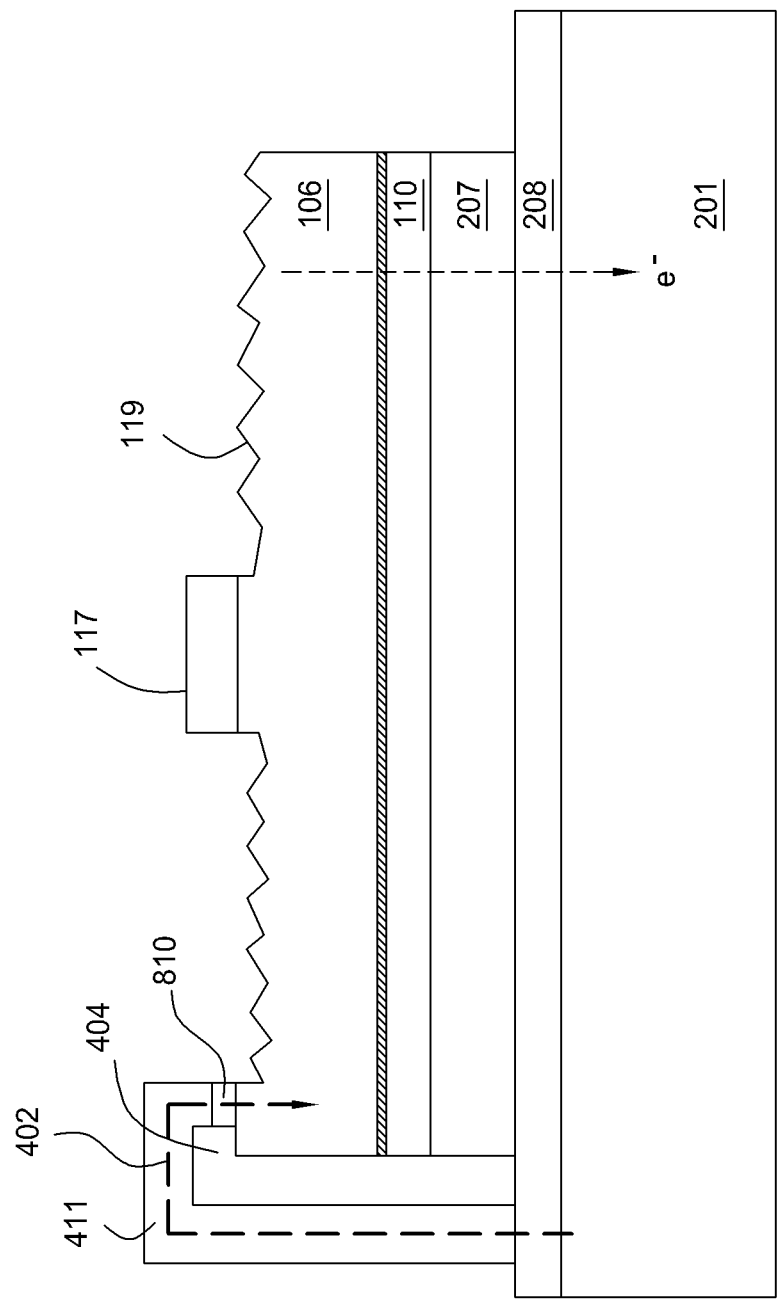
FIG. 8 illustrates an example LED device with a second current path with a protective device.

FIG. 8 illustrates another example LED device with a second current path 402 in accordance with embodiments of the present invention. In this embodiment, a protective device 810 is formed in the second current path 402. As illustrated, the protective device 810 may be formed on the n-type semiconductor layer 106 and may serve to increase the level of transient voltage protection or the current capability, thereby increasing the reliability and/or lifetime of the LED device. The protective device 810 may comprise any suitable material, such as ZnO, ZnS, $TiO_2$, NiO, $SrTiO_3$, $SiO_2$, $Cr_2O_3$, and polymethyl-methylacrylate (PMMA). The thickness of the protective device 810 may range from about 1 nm to 10 μm.

As illustrated in FIG. 9, an LED device with a second current path 402 and a protective device 810, as shown in FIG. 8, may also include a current-guiding structure resulting from separate high and low resistance contact areas 211, 213. For example, these different contact areas may be formed by the interjection of the reflective layer 202 by the barrier metal layer 208, as described above with respect to FIG. 2.

Figure 10:
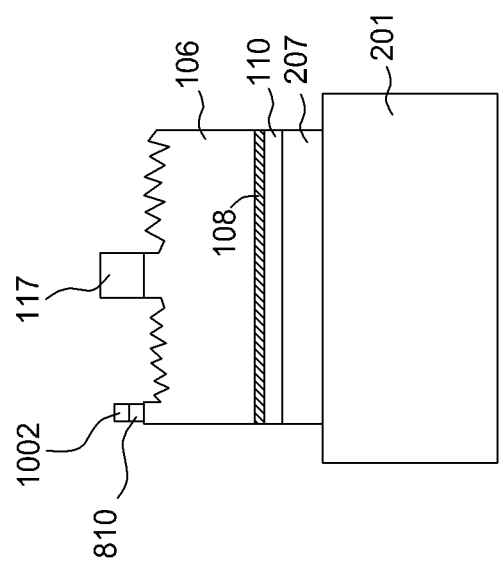
FIG. 10 illustrates an example LED device with a second current path, in chip form.

FIG. 10 illustrates an example LED device with a second current path, in chip form. As illustrated, a bonding metal layer 1002 may be deposited for electrical connection above the protective device 810 in the second current path. The bonding layer 1002 may comprise any suitable material for electrical connection, such as Al, Au, Ti/Au, Ti/Al, Ti/Pt/Au, Cr/Au, Cr/Al, Ni/Au, Ni/Al, or Cr/Ni/Au. The thickness of the bonding layer 1002 may range from 0.5 to 10 µm. For some embodiments, the n-electrode 117 may be extended to allow bonding to a package, as described below with respect to FIG. 11.

Figure 11:
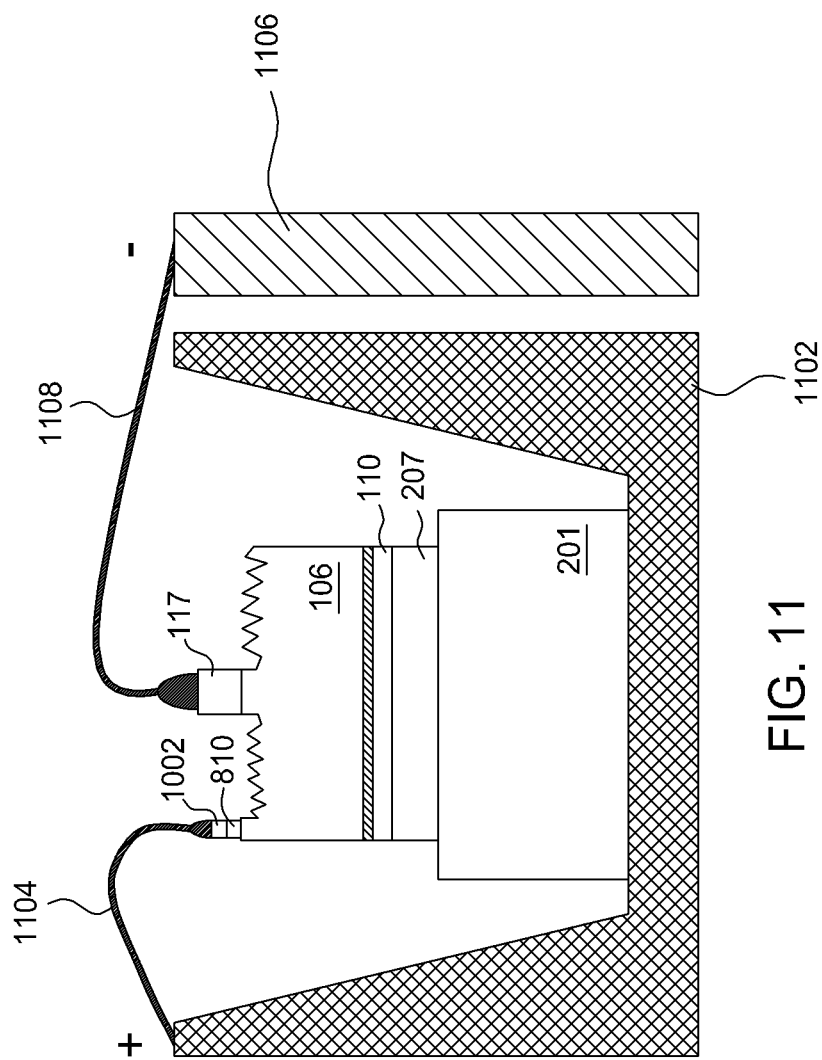
FIG. 11 illustrates an example LED device with a second current path, in package form.

FIG. 11 illustrates the LED device of FIG. 10 in package form. As illustrated, the substrate 201 may be bonded to a common package anode lead 1102. The bonding layer 1002 may be coupled to the anode lead 1102 via a bonding wire 1104 attached to the bonding metal 1002, thereby forming the second current path. The n-electrode 117 may be coupled to a cathode package lead 1106 via another bonding wire 1108.

Figure 12:
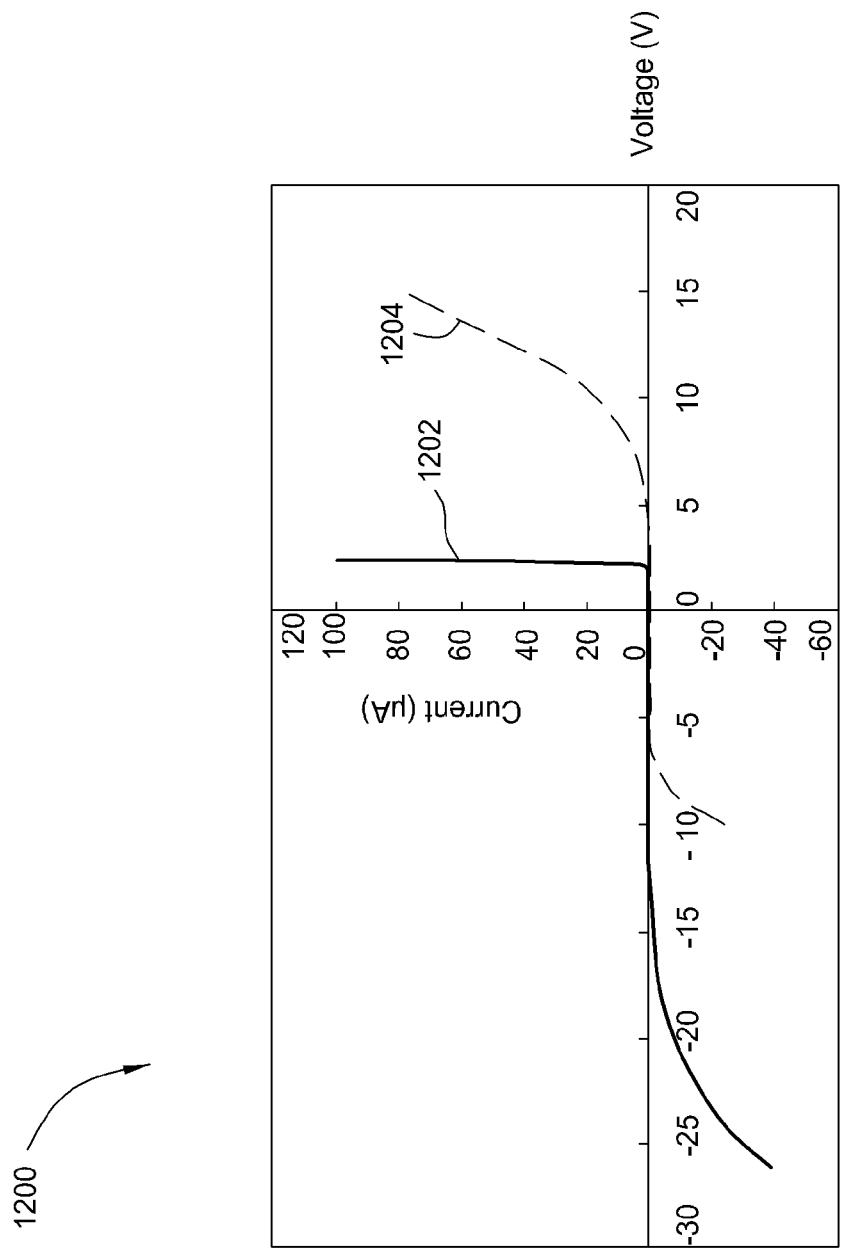
FIG. 12 illustrates an example current vs. voltage (I-V) graph comparing LED devices with and without a second current path.

FIG. 12 is a graph 1200 plotting example I-V curves 1204, 1202 of an LED device with and without a second current path, respectively. As illustrated by the I-V curve 1204, the second current path may allow an LED device to withstand higher voltage without an excessive amount of current, which may prevent damage and/or prolong device life.

Figure 13:
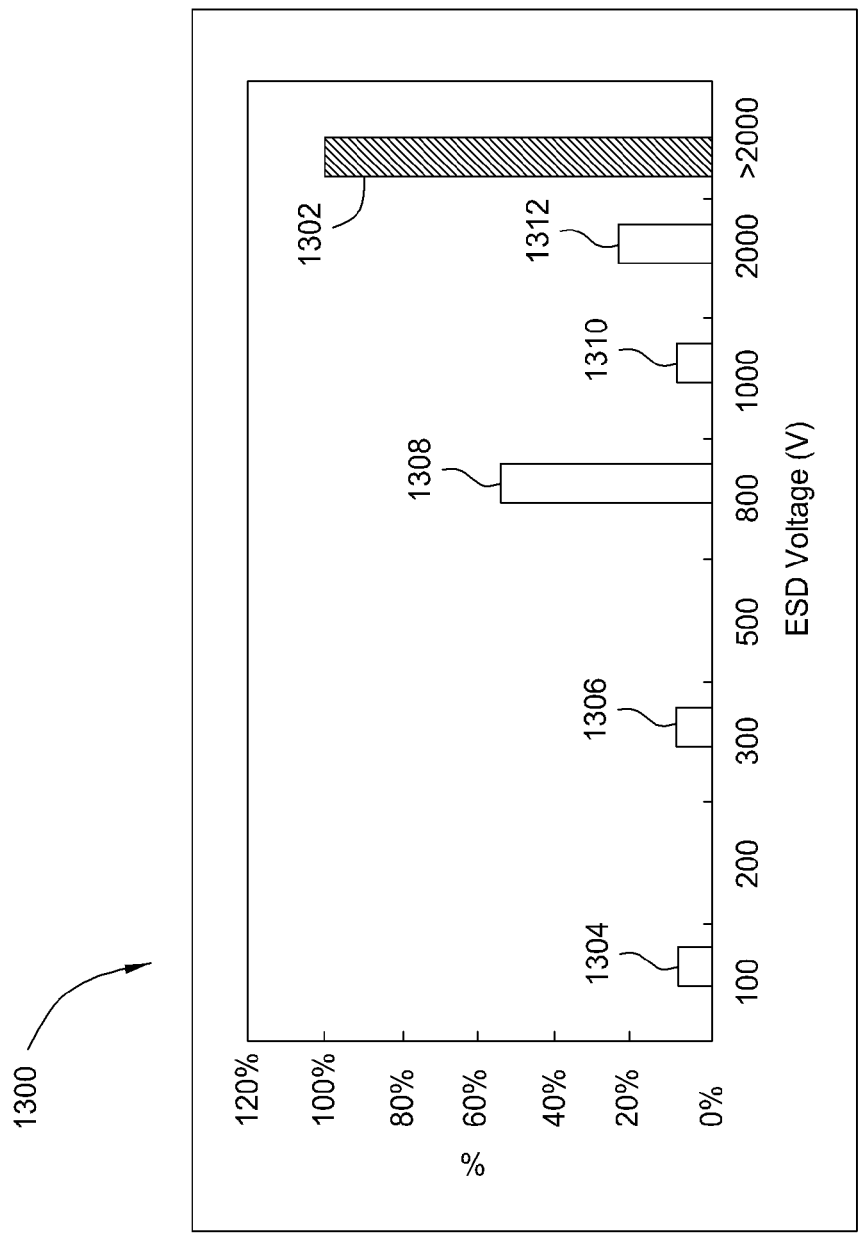
FIG. 13 illustrates an example graph of electrostatic discharge (ESD) level and corresponding survival rate of LED devices with and without a second current path.

FIG. 13 illustrates an example graph 1300 of ESD voltage and corresponding survival rate of LED devices with and without a second current path. In the illustrated scenario, LED devices 1304, 1306, 1308, 1310, 1312 without a second current path pass the test with various survival rates at various ESD voltages. In contrast, LED devices 1302 with the second current path pass at a rate at or near 100%, even at higher ESD voltage levels greater than 2000 V.

While the current-guiding structures described herein have advantages that apply to vertical light-emitting device (VLED) devices, those skilled in the art will recognize that such advantages generally apply to most semiconductor devices. Therefore, the structures described herein may be used to advantage to form low resistance contacts and/or transient suppressors for any type of semiconductor device having a p-n junction.

While the foregoing is directed to particular embodiments, other and further embodiments may be devised without departing from the basic scope thereof, and the scope thereof is determined by the claims that follow.

We claim:

1. A method for guiding current in a light emitting diode (LED) device comprising:
    providing an n-electrode;
    providing an LED stack comprising an n-type semiconductor layer in electrical contact with the n-electrode, an active layer configured to emit light, and a p-type semiconductor layer on the active layer;
    providing a p-electrode in electrical contact with the active layer configured as an electrically conductive current guiding structure for guiding current through the active layer, the p-electrode comprising a high contact resistance area aligned with the n-electrode configured to provide a first current path to a first area of the active layer and a low contact resistance area configured to provide a second current path to at least one second area of the active layer, with the first current path providing less electrical current than the second current path and with an electrical resistance of the high contact resistance area at least double an electrical resistance of the low contact resistance area; and
    guiding current through the LED stack using the p-electrode.

2. The method of claim 1 wherein the p-electrode comprises a barrier metal layer aligned with the active layer and a reflective layer on the barrier metal layer having a space aligned with the high contact resistance area.

3. The method of claim 1 further comprising providing a substrate on the p-electrode and the guiding current step guides the current through the substrate.

4. The method of claim 1 wherein the LED comprises a vertical light-emitting diode (VLED).

5. A method for guiding current in a light emitting diode (LED) device comprising:
    providing an LED stack comprising a first-type semiconductor layer, an active layer on the first-type semiconductor layer configured to emit light, and a second-type semiconductor layer on the active layer;
    providing a first electrode in electrical contact with the first-type semiconductor layer covering a first area of the active layer;
    providing a second electrode in electrical contact with the active layer configured as an electrically conductive current guiding structure for guiding current through the active layer, the second electrode comprising a barrier metal layer and a reflective layer on the barrier metal layer having a space, the barrier metal layer comprising a high contact resistance area aligned with the space in the reflective layer configured to provide a first current path to the first area of the active layer and a low contact resistance area configured to provide a second current path to at least one second area of the active layer, with the first current path providing less electrical current than the second current path and with an electrical resistance of the high contact resistance area at least double an electrical resistance of the low contact resistance area; and
    guiding current through the LED stack using the second electrode.

6. The method of claim 5 wherein the reflective layer comprises a deposited layer patterned to include the space.

7. The method of claim 5 wherein the reflective layer comprises a first material and the barrier metal layer comprises a second material, with the first material having a lower electrical resistance than the second material.

8. The method of claim 5 wherein the LED comprises a vertical light-emitting diode (VLED).

* * * * *